United States Patent [19]
Kim

[11] Patent Number: 5,990,563
[45] Date of Patent: *Nov. 23, 1999

[54] SEMICONDUCTOR PACKAGE HAVING A CONNECTION MEMBER

[75] Inventor: Jin Sung Kim, Cheongju, Rep. of Korea

[73] Assignee: LG Semicon Co., Ltd., Cheongju, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/745,286

[22] Filed: Nov. 8, 1996

[30] Foreign Application Priority Data

Dec. 29, 1995 [KR] Rep. of Korea ............... 95-67334

[51] Int. Cl.$^6$ ................................ H01L 23/485
[52] U.S. Cl. .................. 257/778; 257/687; 257/698; 257/780; 257/783; 257/746
[58] Field of Search ................. 257/778, 780, 257/782, 783, 746, 690, 692, 698, 687

[56] References Cited

U.S. PATENT DOCUMENTS

| | | | |
|---|---|---|---|
| 4,811,081 | 3/1989 | Lyden | 257/746 |
| 5,148,266 | 9/1992 | Khandros et al. | 357/80 |
| 5,258,330 | 11/1993 | Khandros et al. | 437/209 |
| 5,319,242 | 6/1994 | Carney et al. | 257/675 |
| 5,371,404 | 12/1994 | Juskey et al. | 257/778 |
| 5,381,599 | 1/1995 | Hall | 257/787 |
| 5,397,921 | 3/1995 | Karnezos | 257/783 |
| 5,554,887 | 9/1996 | Sawai et al. | 257/737 |
| 5,583,370 | 12/1996 | Higgins, III et al. | 257/667 |
| 5,616,958 | 4/1997 | Laine et al. | 257/783 |
| 5,637,920 | 6/1997 | Loo | 257/778 |
| 5,656,862 | 8/1997 | Papathomas et al. | 257/778 |
| 5,657,206 | 8/1997 | Pedersen et al. | 361/779 |
| 5,726,489 | 3/1998 | Matsuda et al. | 257/659 |
| 5,739,585 | 4/1998 | Akram et al. | 257/698 |
| 5,773,882 | 6/1998 | Iwasaki | 257/692 |

*Primary Examiner*—John Guay
*Attorney, Agent, or Firm*—Fleshner & Kim

[57] ABSTRACT

A ball grid array (BGA) semiconductor package includes a package case having a recess in an upper surface thereof, a semiconductor chip received in the recess, and a connection means provided on an active region of the chip. A molding compound molds the chip and fills a gap between the package case and the connection member. The package enables a thinner package fabrication and reduces an access time of a package device, thereby realizing a high speed device.

23 Claims, 2 Drawing Sheets

SEMICONDUCTOR PACKAGE HAVING A CONNECTION MEMBER

TECHNICAL FIELD

The present invention relates generally to a semiconductor package, and more particularly, to a ball grid array (BGA) package.

BACKGROUND ART

With reference to FIG. 1, a conventional BGA semiconductor chip package includes a substrate 1 having a metallic pattern 3 provided therein. A chip 5 is bondingly mounted by an adhesive 4 onto the substrate 1. Chip pads (not shown) formed on the chip 5 are electrically connected by metallic wires 7 to the metallic pattern 3. A certain portion of the substrate surface including the chip 5 and the metallic wires 7 is covered by epoxy molding compound 6. A plurality of conductive pads 2 are formed on the lower surface of the substrate 1. Solder balls 8 are each formed by a reflow process on a corresponding one of the conductive pads 2. The conventional BGA package is then mounted on a printed circuit board (not shown) using solder balls 8.

The conventional BGA package, however, has a couple of disadvantages. Since the solder balls 8 of the package are positioned on the opposite surface to an active surface or a lower surface of the chip, the electrical path in the package becomes lengthy by the elongation ranging from the chip 5 through the wires 7 up to the PCB, whereby a longer access time in the package has been experienced. Further, there are limitations to the reduction of the package size.

Additionally, there is an embodiment (not shown) in which solder balls are laid out on an active surface of a package chip, however, due to requiring a tab bonding to be applied thereto for interconnection, problems of low productivity along with the difficulty of the fabrication process have yet to be solved.

DISCLOSURE OF THE INVENTION

The present invention is achieved at least in part by an integrated chip package, comprising: a) a substrate having an opening; b) an integrated chip having first and second surfaces and a plurality of chip pads provided on the first surface, the integrated chip being mounted in the opening of the substrate; and c) a connection member being mounted to the first surface of the integrated chip, the connection member having i) a connector having first and second surfaces and a plurality of conductive mediums, ii) a plurality of conductive pads formed on the first surface of the connecter, each conductively coupled to a corresponding conductive medium, and iii) an interconnecting means, formed on the second surface of the connector, for conductively connecting a corresponding chip pad to a corresponding conductive medium; and d) a molding compound for molding the semiconductor chip.

The present invention can be also achieved in part by a connection member for packaging an integrated chip having a plurality of chip pads, comprising: a) a connector having first and second surfaces and a plurality of conductive mediums; b) a plurality of conductive pads formed on the first surface of the connecter, each conductively coupled to a corresponding conductive medium; and c) an interconnecting means, formed on the second surface of the connector, for conductively connecting a corresponding chip pad to a corresponding conductive medium.

The present invention may be achieved at least in part by a package having a connection member comprising a package case having a recess in an upper surface thereof, a semiconductor chip provided in the recess, a connection member provided on an active region of the chip, and a molding compound molding the chip and filling a gap between the package case and the connection member.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

BEST MODE FOR CARRYING OUT THE INVENTION

Figure 1:
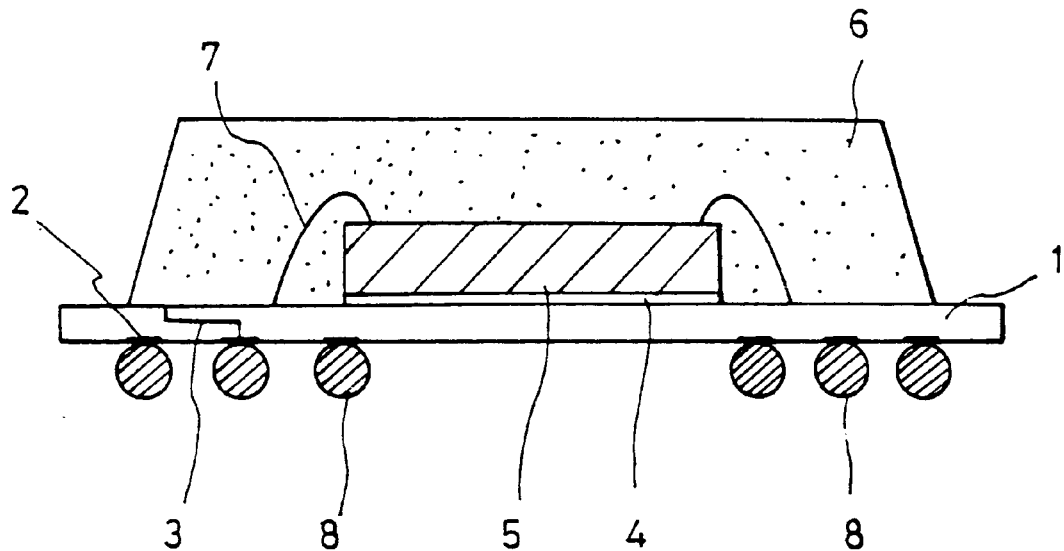
FIG. 1 is a cross-sectional view of a conventional BGA package.
Figure 2:
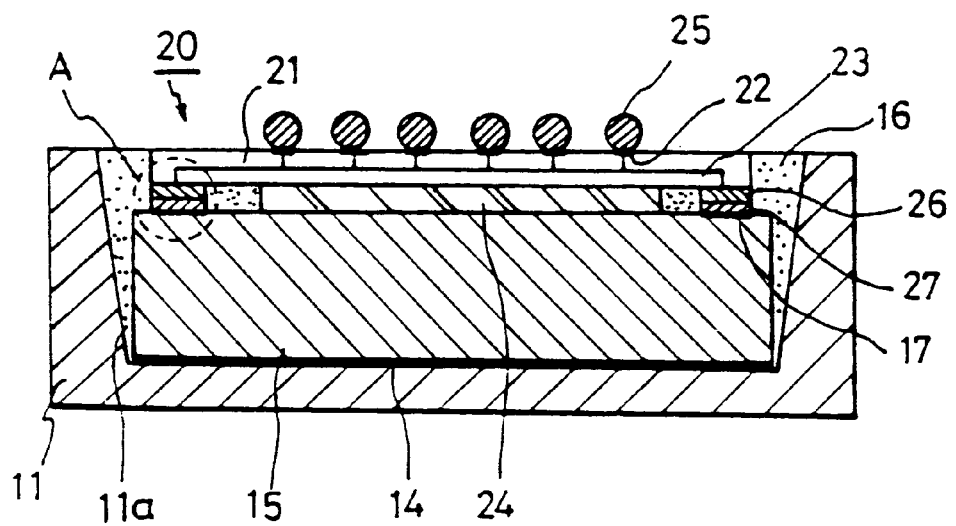
FIG. 2 is a cross-sectional view of a BGA package having a connection member in accordance with the present invention.

As shown in FIG. 2, in an upper surface of a package case or substrate 11 has a recess/opening 11a. The package case 11 is made of a plastic or ceramic material. A semiconductor chip 15 is attached by an epoxy adhesive 14 to the bottom surface of the recess 11a. A plurality of chip pads 17 are provided on a portion of an active surface of the chip 15. On the active surface, a connection member 20 electrically connects with each of the chip pads 17. An epoxy molding compound 16 fills any gap between the package case 11 and the connection member 20 having the chip 15 attached therebeneath. The epoxy molding compound is cured at a certain temperature.

Figure 3:
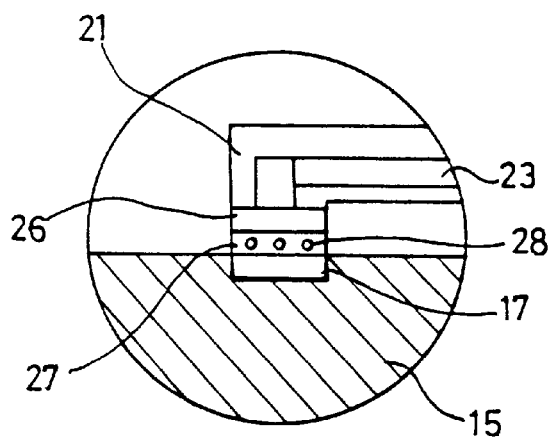
FIG. 3 is an enlarged view of the circled portion A in FIG. 2.
Figure 4:
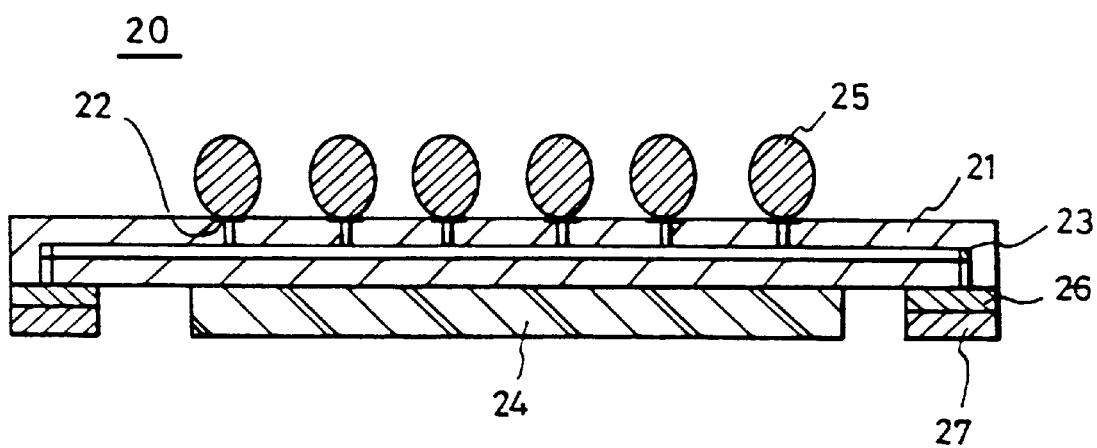
FIG. 4 is a cross-sectional view of a connection member in accordance with the present invention.

Referring to FIG. 3, an adhesive 27 of the connection member 20 electrically connects each of the chip pads 17 using a thermal compression technique. The adhesives 27 are each formed to be slightly smaller than each of the chip pads 17 so as to be easily aligned and adhered to the corresponding one of the chip pads 17. Alternately, solder bumps can be provided on the chip pads 17 so that the solder bumps become electrically connected to the adhesives 27.

The connection member 20 includes a connector 21 having distributing wires 23 therein. An interconnection pad 26 is formed on a side portion of the lower surface of the connector 21 and is electrically connected to the distributing wires 23. A plurality of conductive pads 22 are provided on a portion of the upper surface of the connector 21, and an adhesive 27 contacts each of the connection pads. Ready made solder balls 25 can be attached to the surface of the conductive pads 22 for serving as input/output terminals of the connection member 20, or a solder bump (not shown) can be directly formed on each of the conductive pads 22 as an input/output terminal. An electrical path is created by the linking of the chip 11, the chip pad 17, the interconnection pad 26 and the adhesive 27, which has an anisotropic conductive property.

The connector 21, which is a flexible printed circuit, has a single or double sided adhesion film 24 attached therebeneath. The film 24 is formed of a thermosetting or thermoplastic resin. The connection member 20 is fixed by means of thermal compression to the adhesion film 24 and is provided on a central portion of the active surface of the chip 15. The connector 21 and the conductive film 24 range from 5 to 400 μm and 10 to 400 μm, respectively, in thickness.

The interconnection pads 26 are deposited on a side portion of the lower surface of the connector 21, using sputtering, electroplating or evaporation. Each of the interconnection pads 26 are formed of copper or copper/gold compound and has a thickness of at most 1 mm and an area of more than 0.33 mm$^2$. The adhesive 27 is a solid anisotropic conductive adhesive or a solid anisotropic film. The adhesive 27 ranges from 5 to 200 μm in thickness, in which conductive balls 28 are provided therein.

Consequently, the BGA chip package in accordance with the present invention enables reducing a signal access time by electrically connecting the connection member to the chip pads, thus making the package appropriate for a high speed device. Further, since the adhesives of the connection member and the chip pads are directly connected to each other, the pitch between the chip pads can be reduced from the present 160 μm down to 30–40 μm. Also, with regard to a multi-pin semiconductor package having more than 200 pins, an increase in size of a semiconductor package caused by a widened pad pitch can be prevented.

The process steps are also reduced due to the concurrent bonding of the chip pads and the connection member, which enables an increased package productivity. Since the solder balls can be readily made, cost reduction in accordance with the process simplification can be realized. Additionally, since the input/output terminals are formed on the upper surface of the connection member, a decrease in the package size can be easily obtained, thereby enabling fabrication of a thinner BGA package.

The foregoing embodiment is merely exemplary and not to be construed as limiting the present invention. The present scheme may be readily applied to other types of packages. Further, the present invention discloses, as an example, the chip being encapsulated by the molding compound. As can be appreciated, the present invention is applicable to packages which do not completely encapsulate the semiconductor chip, i.e., the molding resin packages or molds the semiconductor chip. In the foregoing embodiments, the surfaces were referred to as upper and lower surfaces or top and bottom surfaces for convenience to illustrate the present invention in view of the figures. As can be appreciated, the surface reference is dependent upon the orientation of the package. The description of the present invention is intended to be illustrative, and not limiting the scope of the claims. Many alternatives, modifications and variations will be apparent to those skilled in the art.

I claim:

1. A ball grid array semiconductor package, comprising:
   a package case having a recess in an upper surface thereof;
   a semiconductor chip provided in the recess;
   a connector having connection pads, provided on an active region of the chip that connects the semiconductor chip to a circuit board, wherein the connection pads of the connector are connected to corresponding bond pads on the chip by a conductive adhesive containing conductive balls;
   an adhesive layer configured to attach the connector to the chip, wherein a thickness of the adhesive layer is approximately equal to a combined thickness of the connection pads and the conductive adhesive; and
   a molding compound molding the chip and filling any gap between the package case and the connector.

2. The package of claim 1, wherein the adhesive layer comprises a thermoplastic/thermosetting adhesion tape that attaches the connector to the active region of the chip.

3. The package of claim 1, wherein the package case is formed of one of a plastic material and a ceramic material.

4. The package of claim 1, wherein the connector further comprises;
   a connector member having wires therein, wherein the connection pads are electrically coupled to the wires, and wherein the connection pads are formed on a first side of the connector member,
   conductive pads formed on a second side portion of the connector and connected to corresponding ones of the wires; and
   an input/output terminal formed on each of the conductive pads.

5. The package of claim 4, wherein the output terminals are one of solder balls and solder bumps.

6. The package of claim 4, wherein the connector neons comprises a flexible printed circuit.

7. The package of claim 4, wherein the connection pads are formed by a deposition technique selected from the group consisting of sputtering, electroplating and evaporation.

8. The package of claim 7, wherein the connection pads are formed of a material selected from the group consisting of gold and a composition of copper/gold.

9. The package of claim 4, wherein the conductive adhesive is one of an anisotropic conductive adhesive and an anisotropic conductive film.

10. The package of claim 4, wherein the molding compound encapsulates the chip.

11. An integrated chip package, comprising:
    a) a substrate having an opening;
    b) an integrated chip having first and second surfaces and a plurality of chip pads provided on said first surface, said integrated chip being mounted in said opening of said substrate;
    c) a connection member being mounted to said first surface of said integrated chip by an adhesive layer, said connection member comprising:
       i) a connector having first and second surfaces and a plurality of conductive media,
       ii) a plurality of conductive pads formed on said first surface of said connector, each conductively coupled to a corresponding conductive medium, and
       iii) a plurality of connection pads formed on said second surface of said connector, wherein each connection pad conductively connects a corresponding chip pad to a corresponding conductive medium with a conductive adhesive containing conductive balls and wherein a combined thickness of the connection pads and the conductive adhesive is approximately equal to a thickness of the adhesive layer; and
    d) a molding compound for molding said integrated chip.

12. The package of claim 11, wherein said opening is a recess having a lower surface and side surfaces and wherein an adhesive attaches said integrated chip to said lower surface.

13. The package of claim 12, wherein said molding compound fills any gap between said side surfaces of the recess and said integrated chip.

14. The package of claim 11, wherein said chip pads are located on a peripheral portion of said first surface of said integrated chip.

15. The package of claim 11, wherein said connector is a printed circuit and said plurality of conductive media comprise a plurality of distribution wires embedded in said printed circuit.

16. The package of claim 11, wherein said connection pads are one of a copper and copper/gold compound.

17. The package of claim 11, wherein said conductive adhesive is one of an anisotropic conductive adhesive and an anisotropic conductive film.

18. The package of claim 11, wherein said molding compound encapsulates the integrated chip.

19. The package of claim 11, further comprising a plurality of solder balls attached to said plurality of conductive pads.

20. A connection member for packaging an integrated chip having a plurality of chip pads, comprising:
 a) a connector having first and second surfaces and a plurality of conductive media;
 b) a plurality of conductive pads formed on said first surface of said connector, each conductively coupled to a corresponding conductive medium;
 c) an adhesive layer attached to the second surface of the connector and configured to attach the connector to an integrated chip; and
 d) a plurality of connection pads formed on said second surface of said connector, wherein each connection pad is one of a copper and copper/gold compound and is configured to conductively connect a chip pad of a chip to a corresponding conductive medium with a conductive adhesive having conductive balls and wherein a combined thickness of the connection pads and the conductive adhesive is approximately equal to a thickness of the adhesive layer.

21. The connection member of claim 20, wherein said connector is a printed circuit and said plurality of conductive media comprise a plurality of distribution wires embedded in said printed circuit.

22. The connection member of claim 20, wherein said conductive adhesive is one of anisotropic conductive adhesive and solid anisotropic film.

23. The connection member of claim 20, further comprising a plurality of solder balls attached to said plurality of conductive pads.

* * * * *